(12) United States Patent
Kalia et al.

(10) Patent No.: US 9,484,858 B1
(45) Date of Patent: Nov. 1, 2016

(54) INDUCTIVE COUPLED PASS TRANSISTOR QUADRATURE VOLTAGE CONTROLLED OSCILLATOR

(71) Applicant: Texas Instruments Incorporated, Dallas, TX (US)

(72) Inventors: Sachin Kalia, Minneapolis, MN (US); Bradley A. Kramer, Plano, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/986,607

(22) Filed: Dec. 31, 2015

(51) Int. Cl.
*H03B 27/00* (2006.01)
*H03B 5/12* (2006.01)

(52) U.S. Cl.
CPC .......... *H03B 27/00* (2013.01); *H03B 5/1212* (2013.01); *H03B 5/1228* (2013.01); *H03B 5/1296* (2013.01)

(58) Field of Classification Search
CPC ...... H03B 5/12; H03B 5/124; H03B 5/1256; H03B 5/1268; H03B 5/1296
USPC ........................ 331/36 L, 117 R, 117 FE, 167
See application file for complete search history.

(56) References Cited

U.S. PATENT DOCUMENTS

| | | | |
|---|---|---|---|
| 8,717,112 B2* | 5/2014 | Chang ................ | H03B 5/1228 331/117 FE |
| 2011/0050354 A1* | 3/2011 | Hirashiki ............. | H03B 27/00 332/105 |
| 2014/0070898 A1* | 3/2014 | Shirinfar ............. | H03B 5/1228 331/117 FE |

OTHER PUBLICATIONS

Design of low-phase-noise CMOS transformer-based gate-coupled quadrature VCO; Yi Shen, K.F. Tsang, Wah Ching Lee, Faan Hei Hung, Iasonas F. Triantis and Kai Xuan; Electronics Letters Mar. 13, 2014 vol. 50 No. 6 pp. 434-436; doi: 10.1049/el.2014.0093.
A 49-to-62GHz CMOS Quadrature VCO with Bimodal Enhanced Magnetic Tuning; Liang Wu, Howard C. Luong; 978-1-4673-2213-3/12; 2012 IEEE; pp. 297-300.
Design of a 4 GHz Quadrature LC-VCO with Transformer Coupling; Wu xiushan, Wang zhigong, Li zhiqun , Li qing; 978-1-4244-1880-0/08; 2008 IEEE.
20 GHz Integrated CMOS Frequency Sources with a Quadrature VCO using Transformers; Sangsoo Ko, Jeong-Geun Kim, Tdeksang'song, Euisik Yoon, and Songcheol Hong; 0-7803-8333-8/04; 2004 IEEE; pp. 269-272.

* cited by examiner

*Primary Examiner* — Jeffrey Shin
(74) *Attorney, Agent, or Firm* — John R. Pessetto; Charles A. Brill; Frank D. Cimino

(57) ABSTRACT

A quadrature voltage controlled oscillator (QVCO) for providing an oscillating output signal. The QVCO includes a first oscillating circuit for producing a first output signal and a second output signal, those signals being a first set of antiphase signals. The QVCO also includes a second oscillating circuit for producing a first output signal and a second output signal, those signals being a second set of antiphase signals. The first oscillating circuit also has injection circuitry for injecting the second set of antiphase signals without a DC bias into the first output signal and the second output signal, and the second oscillating circuit also has injection circuitry for injecting the first set of antiphase signals without a DC bias into the third output signal and the fourth output signal.

12 Claims, 4 Drawing Sheets

US 9,484,858 B1

INDUCTIVE COUPLED PASS TRANSISTOR QUADRATURE VOLTAGE CONTROLLED OSCILLATOR

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to voltage controlled oscillator (VCO) technology and, more particularly, to a quadrature VCO (QVCO).

A VCO is a device (i.e., oscillator) that outputs an oscillating signal with a frequency that is controlled by the level of a bias voltage applied to the VCO. A fixed DC bias voltage to the VCO, therefore, should ideally produce a fixed output frequency signal, whereas that bias voltage also may be varied so as to vary the VCO output frequency. As to the latter, therefore, a modulating bias signal may be applied to cause the VCO to output a signal with a modulating frequency (or phase).

A certain type of modulation scheme that packs more than 1 bit/symbol for communicating data, and relevant to the preferred embodiments is quadrature phase-shift keying (QPSK). In QPSK, a VCO provides quadrature oscillating signals, thereby operating as a QVCO, where the quadrature signals consist of four different oscillating signals, each 90 degrees apart from the others. More specifically, as a type of phase-shift keying (PSK), QPSK communicates data by modulating (i.e., changing) a phase of a carrier signal. The term "quadrature" in QPSK indicates that there are four different phases, each preferably orthogonal with respect to one another, for the data modulation. More specifically, therefore, a single data quantity, or "symbol," may be represented by any one of the four available phases, typically equispaced in the QPSK constellation at locations that are 90 degrees apart. Each location of these separate locations may represent a different one-of-four combination of two binary bits, thereby permitting communication of a symbol representing a binary value of 11, 01, 00, or 10. In QPSK, such data is modulated, and demodulated, typically by separating a bit stream into two separate bit streams, denoted as an in-phase stream designated as I and a quadrature phase designated as Q. The I data is modulated by a first signal (e.g., sine wave), while the Q data is modulated by a second signal that is 90 degrees apart (e.g., cosine wave) from the first signal, with the results added to provide the transmitted QPSK signal. Demodulation is achieved in a reverse process.

Given the preceding, of note in connection with QPSK methodology is that it involves quadrature phases, and in electronic circuits such phases are typically implemented using a VCO that is locked into quadratures, that is, having four different outputs that, as introduced earlier, are 90 degrees apart from one another. Such an architecture is typically referred to as a quadrature VCO, or abbreviated as QVCO. Further, quadrature local oscillation also may be used and be important in other applications, such as image rejection in receivers. By way of further background, therefore, two prior art QVCOs are described below.

FIG. 1 illustrates a schematic of a prior art parallel injection QVCO shown generally at 10. QVCO 10 includes bias control circuitry 12 that may be constructed according to known principles for biasing various illustrated devices, as further explored below. QVCO 10 also includes two symmetric oscillating circuits 20 and 50, which are coupled together so as to lock the operation and oscillating signals of the two in quadrature, as will be explained later. Since circuits 20 and 50 are symmetric, the following discussion will detail circuit 20 by way of example, followed by an overview of the comparable circuit 50.

Oscillating circuit 20 includes a first inductor 22 and a second inductor 24, each having a respective first terminal $22_{T1}$ and $24_{T1}$ connected to receive a fixed voltage potential, shown as $V_{DD}$. A second terminal $22_{T2}$ of inductor 22 is connected to a node 26, which is also connected to a drain of an nMOS transistor 28, and a second terminal $24_{T2}$ of inductor 24 is connected to a node 30, which is also connected to a drain of an nMOS transistor 32. The sources of nMOS transistors 28 and 32 are connected to a node 34, and the gates of nMOS transistors 28 and 32 are cross-coupled, that is, the gate of nMOS transistor 28 is connected to the drain of nMOS transistor 32, and the gate of nMOS transistor 32 is connected to the drain of nMOS transistor 28. Node 34 is connected to the drain of an nMOS transistor 36, which has its gate connected to bias control circuitry 12 and its source connected to a lower reference potential, shown by way of example as ground.

Oscillating circuit 20 also includes two additional nMOS transistors 38 and 40, each of which is connected for parallel injection of respective output signals provided by oscillating circuit 50, as is now explored. The drain of nMOS transistor 38 is connected to node 26, and the source of nMOS transistor 38 is connected to a node 42. The gate of nMOS transistor 38 is connected to receive an oscillating output signal Q− from oscillating circuit 50 and a DC bias signal from bias control circuitry 12, both via a decoupling circuit 44. Decoupling circuit 44 may be constructed in various fashions known in the art, so by convention and for sake of example this is shown in FIG. 1 as the AC signal of Q− connected through a capacitor C and the DC bias from circuitry 12 connected through a resistor R. The drain of nMOS transistor 40 is connected to node 30, and the source of nMOS transistor 40 is connected to node 42. The gate of nMOS transistor 40 is connected to receive an oscillating output signal Q+ from oscillating circuit 50 and a DC bias signal, both via a decoupling circuit 46. The illustration of decoupling circuit 46 is the same as provided for decoupling circuit 44, where here the AC signal of Q+ is connected through a capacitor C and the DC bias from circuitry 12 is connected through a resistor R. An nMOS transistor 48 has its drain connected to node 42, its source connected to the lower reference potential (e.g., ground), and its gate to bias control circuitry 12. Lastly, note that node 26 provides a first oscillating output signal I+, and node 30 provides a second oscillating output signal I−, where these two signals are ideally 180 degrees apart, as also further detailed later.

As introduced above, oscillating circuit 50 is comparable in devices and connections with respect to oscillating circuit 20. As now will be appreciated, however, oscillating circuit 50 provides the quadrature Q outputs and operates in response to the in-phase I inputs (as output from oscillating circuit 20). Specifically, oscillating circuit 50 includes a first inductor 52 and a second inductor 54, each having a respective first terminal $52_{T1}$ and $54_{T1}$ connected to receive the fixed voltage potential, $V_{DD}$. A second terminal $52_{T2}$ of inductor 52 is connected to a node 56, which is also connected to a drain of an nMOS transistor 58, and a second terminal $54_{T2}$ of inductor 54 is connected to a node 60, which is also connected to a drain of an nMOS transistor 62. The sources of nMOS transistors 58 and 62 are connected to a node 64, and the gates of nMOS transistors 58 and 62 are cross-coupled, that is, the gate of nMOS transistor 58 is connected to the drain of nMOS transistor 62, and the gate of nMOS transistor 62 is connected to the drain of nMOS transistor 58. Node 64 is connected to the drain of an nMOS transistor 66, which has its gate connected to bias control circuitry 12 and its source connected to the lower reference potential (e.g., ground).

Oscillating circuit 50 also includes two additional nMOS transistors 68 and 70, each of which is connected for parallel injection of the respective output signals of oscillating circuit 20, as is now explored. The drain of nMOS transistor 68 is connected to node 56, and the source of nMOS transistor 68 is connected to a node 72. The gate of nMOS transistor 68 is connected to receive an oscillating output signal I+ from oscillating circuit 20 and a DC biasing signal, both via a decoupling circuit 74. Thus, as in the case of above-described decoupling circuits, the AC signal of I+ is connected through a capacitor C and the DC bias from circuitry 12 is connected through a resistor R. The drain of nMOS transistor 70 is connected to node 60, and the source of nMOS transistor 70 is connected to node 72. The gate of nMOS transistor 70 is connected to receive an oscillating output signal I− from oscillating circuit 20 and a DC biasing signal, both via a decoupling circuit 76. Thus, as in the case of above-described decoupling circuits, the AC signal of I− is connected through a capacitor C and the DC bias from circuitry 12 is connected through a resistor R. An nMOS transistor 78 has its drain connected to node 72, its source connected to the lower reference potential (e.g., ground), and its gate to bias control circuitry 12. Lastly, note that node 56 provides a first oscillating output signal Q+, and node 60 provides a second oscillating output signal Q−, where these two signals are ideally 180 degrees apart, as also further detailed later.

The operation of QVCO 10 is now generally described for context in this document, with additional aspects readily known or ascertainable by one skilled in the art. Looking first to oscillating circuit 20, in general an oscillating loop may be observed with respect to inductors 22 and 24 and nMOS transistors 28 and 32. Particularly, with this loop, charge oscillates between the inductance and inherent transistor capacitance, and while resistance also exists in the circuit that would tend to diminish the response of the circuit, as known in the VCO art the cross-coupling of the gates of nMOS transistors 28 and 32 provides a negative trans-conductance, sometimes also referred to as a −R, so as to compensate for this resistance and to maintain the loop in oscillation. Thus, this loop provides the oscillating signals I+ and I− which, as charge is exchanged in the loop and given the cross-coupling of nMOS transistors 28 and 32, causes the drain of one of those transistors to rise in voltage while the other falls in complementary fashion, and vice versa, such that I+ and I− at those drains are anti-phase signals, that is, they remain 180 degrees (i.e., one half-period) apart from one another. In addition to the above-described loop operation, note also that each of nMOS transistors 38 and 40, in parallel with the combination of nMOS transistors 28 and 32, injects or modulates into the loop the signals Q− and Q+, respectively. Specifically, bias control circuitry 12 maintains nMOS transistor 48 on as a current source while applying a DC biasing voltage to the gates of each of nMOS transistors 38 and 40, so each of nMOS transistors 38 and 40 remains on and conducts current further in response to the rise and fall of the respective inputs Q− and Q+. Thus, the total current through nMOS transistors 38 and 40 remains constant (i.e., equal to that of the sourcing nMOS transistor 48), whereby as the current through one of those transistors increases the current through the other decreases, and vice versa, in a complementary fashion, thus maintaining the total.

Looking to oscillating circuit 50, it generally operates in the same way as oscillating circuit 20, albeit in a phase-shifted fashion, and the reader is assumed familiar therefore with the previous discussion which is now briefly summarized with respect to the comparable circuit 50. Generally, the loop of inductors 52 and 54 and nMOS transistors 58 and 62 oscillates and the opposing complementary potential at the drains of those transistors provides the antiphase output pairing of Q+ and Q−. Further, that loop is modulated by the injection of I+ and I−, from circuit 20, into the respective gates of nMOS transistors 68 and 70, with each of those transistors always on in response to the DC bias at their gates and together conducting a total current matching that sourced by nMOS transistor 78, whereby as the current through one of those transistors increases the current through the other decreases, and vice versa, in a complementary fashion, thus maintaining the total.

Having described the general operation of circuits 20 and 50, note further that such operation locks oscillating circuit 20 in quadrature with respect to oscillating circuit 50. As noted above, in each circuit the outputs (i.e., either Q+ and Q− or I+ and I−) are antiphase signals. By virtue of the cross-coupling, two tanks and the devices being identical and the magnitude of the phasor current in the two tanks to be equal, each of the four outputs will remain in quadrature, 90 degrees apart.

FIG. 2 illustrates a schematic of a prior art series injection QVCO shown generally at 80. QVCO 80 includes bias control circuitry 110 that may be constructed according to known principles for biasing various illustrated devices, as further explored below. QVCO 80 also includes two symmetric oscillating circuits 90 and 120, which are coupled together so as to lock the operation and oscillating signals of the two in quadrature, as will be explained later. Since circuits 90 and 120 are symmetric, the following discussion will detail circuit 90 by way of example, followed by an overview of the comparable circuit 120.

Oscillating circuit 90 includes a first inductor 92 and a second inductor 94, each having a respective first terminal $92_{T1}$ and $94_{T1}$ connected to receive a fixed voltage potential, shown as $V_{DD}$. A second terminal $92_{T2}$ of inductor 92 is connected to a node 96, which is also connected to a drain of an nMOS transistor 98, and a second terminal $94_{T2}$ of inductor 94 is connected to a node 100, which is also connected to a drain of an nMOS transistor 102. The source of nMOS transistor 98 is connected to a node 104, and the source of nMOS transistor 102 is connected to a node 106. The gates of nMOS transistors 98 and 102 are cross-coupled, that is, the gate of nMOS transistor 98 is connected to the drain of nMOS transistor 102, and the gate of nMOS transistor 102 is connected to the drain of nMOS transistor 98. Node 104 is connected to the drain of an nMOS transistor 108, which has its gate connected to a decoupling circuit 110 and its source connected to a node 112. Decoupling circuit 110 follows the same convention of FIG. 1, so again an AC signal of Q− is connected through a capacitor C and the DC bias from circuitry 110 is connected through a resistor R, both to the gate of nMOS transistor 108. Node 106 is connected to the drain of an nMOS transistor 114, which has its gate connected to a decoupling circuit 116 and its source connected to node 112. Decoupling circuit 116 connects Q+ through a capacitor C, and the DC bias from circuitry 110 through a resistor R, to the gate of nMOS transistor 114. Node 112 is connected to the drain of an nMOS transistor 118, which has its source connected to ground and its gate connected to bias control circuitry 110.

As introduced above, oscillating circuit 120 is comparable in devices and connections with respect to oscillating circuit 90. Oscillating circuit 120, however, provides the quadrature Q outputs and operates in response to the in-phase I inputs as output from oscillating circuit 90. Specifically, oscillating circuit 120 includes a first inductor 122 and a second inductor 124, each having a respective first terminal $122_{T1}$ and $124_{T1}$ connected to receive the fixed voltage potential, $V_{DD}$. A second terminal $122_{T2}$ of inductor 122 is connected to a node 126, which is also connected to a drain of an nMOS transistor 128, and a second terminal $124_{T2}$ of inductor 124 is connected to a node 130, which is also connected to a drain of an nMOS transistor 132. The source of nMOS transistor 128 is connected to a node 134, and the source of nMOS transistor 132 is connected to a node 136. The gates of nMOS transistors 128 and 132 are cross-coupled, that is, the gate of nMOS transistor 128 is connected to the drain of nMOS transistor 132, and the gate of nMOS transistor 132 is connected to the drain of nMOS transistor 128. Node 134 is connected to the drain of an nMOS transistor 138, which has its gate connected to a decoupling circuit 140 and its source connected to a node 142. Decoupling circuit 140 couples an AC signal of I+ through a capacitor C, and the DC bias from circuitry 110 through a resistor R, to the gate of nMOS transistor 138. Node 136 is connected to the drain of an nMOS transistor 144, which has its gate connected to a decoupling circuit 146 and its source connected to node 142. Decoupling circuit 146 connects I− through a capacitor C, and the DC bias from circuitry 110 through a resistor R, to the gate of nMOS transistor 144. Node 142 is connected to the drain of an nMOS transistor 148, which has its source connected to ground and its gate connected to bias control circuitry 110.

The operation of QVCO 80 is now generally described for context in this document, with additional aspects readily known or ascertainable by one skilled in the art.

Looking first to oscillating circuit 90, in general an oscillating loop may be observed with respect to inductors 92 and 94, cross-coupled nMOS transistors 98 and 102, and the nMOS transistors 108 and 114 respectively in series with nMOS transistors 98 and 102. Specifically, bias control circuitry 110 maintains nMOS transistor 118 on as a current source and applies a DC biasing voltage to the gates of each of nMOS transistors 108 and 114, so each of nMOS transistors 108 and 114 remains on and conducts current— moreover, as these transistors are in series, respectively, with nMOS transistors 98 and 102, those transistors also commute the same current, respectively, as nMOS transistors 108 and 114, with the sum total current through all four transistors remaining constant and equal to that sourced by nMOS transistor 118. Moreover, with this loop, charge oscillates between the inductance and inherent transistor capacitance, with the cross-coupling of the gates of nMOS transistors 98 and 102 providing a negative trans-conductance to maintain the loop in oscillation. Thus, this loop provides the antiphase oscillating signals I+ and I−, as charge is exchanged in the loop. Further, nMOS transistors 98 and 102 modulate the loop oscillation by injecting the phases of Q− and Q+, respectively, into the oscillating signal.

Looking to oscillating circuit 120, it generally operates in the same way as oscillating circuit 90, albeit in phase-shifted fashion. Generally, bias control circuitry 110 maintains nMOS transistor 148 on as a current source and applies a DC biasing voltage to the gates of each of nMOS transistors 138 and 144, so each of nMOS transistors 138 and 144 remains on and conducts current— moreover, as these transistors are in series, respectively with nMOS transistors 128 and 132, those transistors also commute the same current, respectively, as nMOS transistors 138 and 144, with the sum total current through all four transistors remaining constant and equal to that sourced by nMOS transistor 148. Moreover, with this loop, charge oscillates between the inductance and inherent transistor capacitance, with the cross-coupling of the gates of nMOS transistors 128 and 132 providing a negative trans-conductance to maintain the loop in oscillation. Thus, this loop provides the antiphase oscillating signals Q+ and Q−, as charge is exchanged in the loop. Further, nMOS transistors 138 and 144 modulate the loop oscillation by injecting the phases of I+ and I−, respectively, into the oscillating signal.

Having described the general operation of circuits 90 and 120, note further that such operation locks oscillating circuit 90 in quadrature with respect to oscillating circuit 120. By virtue of the cross-coupling, two tanks and the devices being identical and the magnitude of the phasor current in the two tanks to be equal, each of the four outputs will remain in quadrature, 90 degrees apart.

While the above and related approaches have served various needs in the prior art, they also provide various drawbacks. For example, the present inventors have observed that the transistors injecting I/Q signals are always on, thereby causing a considerable amount of power consumption. In addition, such a configuration introduces undesirable flicker noise into the QVCO, which also gets upconverted to the frequency of interest/oscillation, thereby adding noise into the system that uses the oscillating signal.

Given the preceding, the present inventors seek to improve upon the prior art, as further detailed below.

BRIEF SUMMARY OF THE INVENTION

In a preferred embodiment, there is a quadrature voltage controlled oscillator (QVCO) for providing an oscillating output signal. The QVCO includes a first oscillating circuit for producing a first output signal and a second output signal, those signals being a first set of antiphase signals. The QVCO also includes a second oscillating circuit for producing a first output signal and a second output signal, those signals being a second set of antiphase signals. The first oscillating circuit also has injection circuitry for injecting the second set of antiphase signals without a DC current into the first output signal and the second output signal, and the second oscillating circuit also has injection circuitry for injecting the first set of antiphase signals without a DC current into the third output signal and the fourth output signal.

Numerous other inventive aspects are also disclosed and claimed.

DETAILED DESCRIPTION OF EMBODIMENTS

Figure 1:
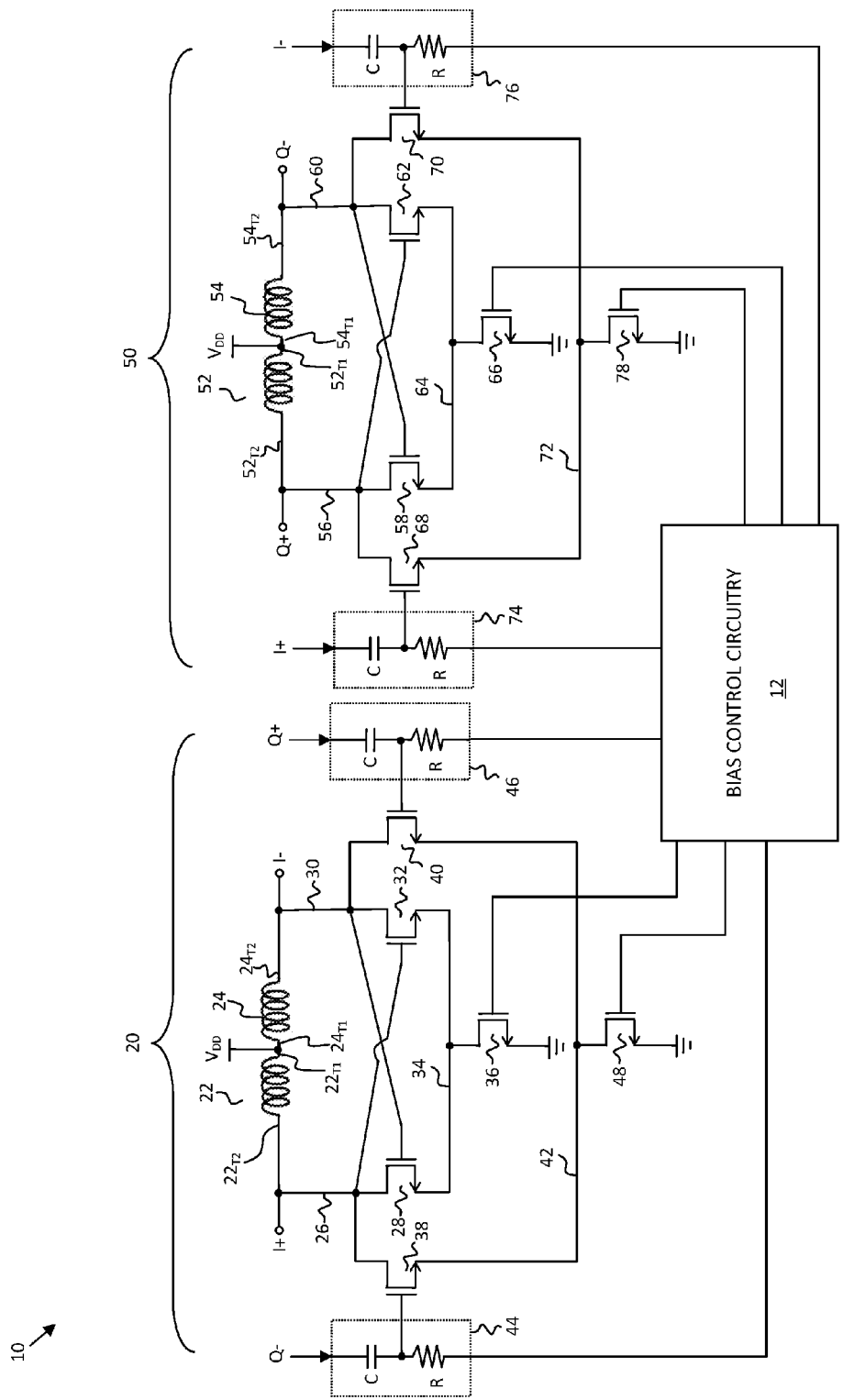
FIG. 1 illustrates an electrical schematic of a prior art parallel injection QVCO.
Figure 2:
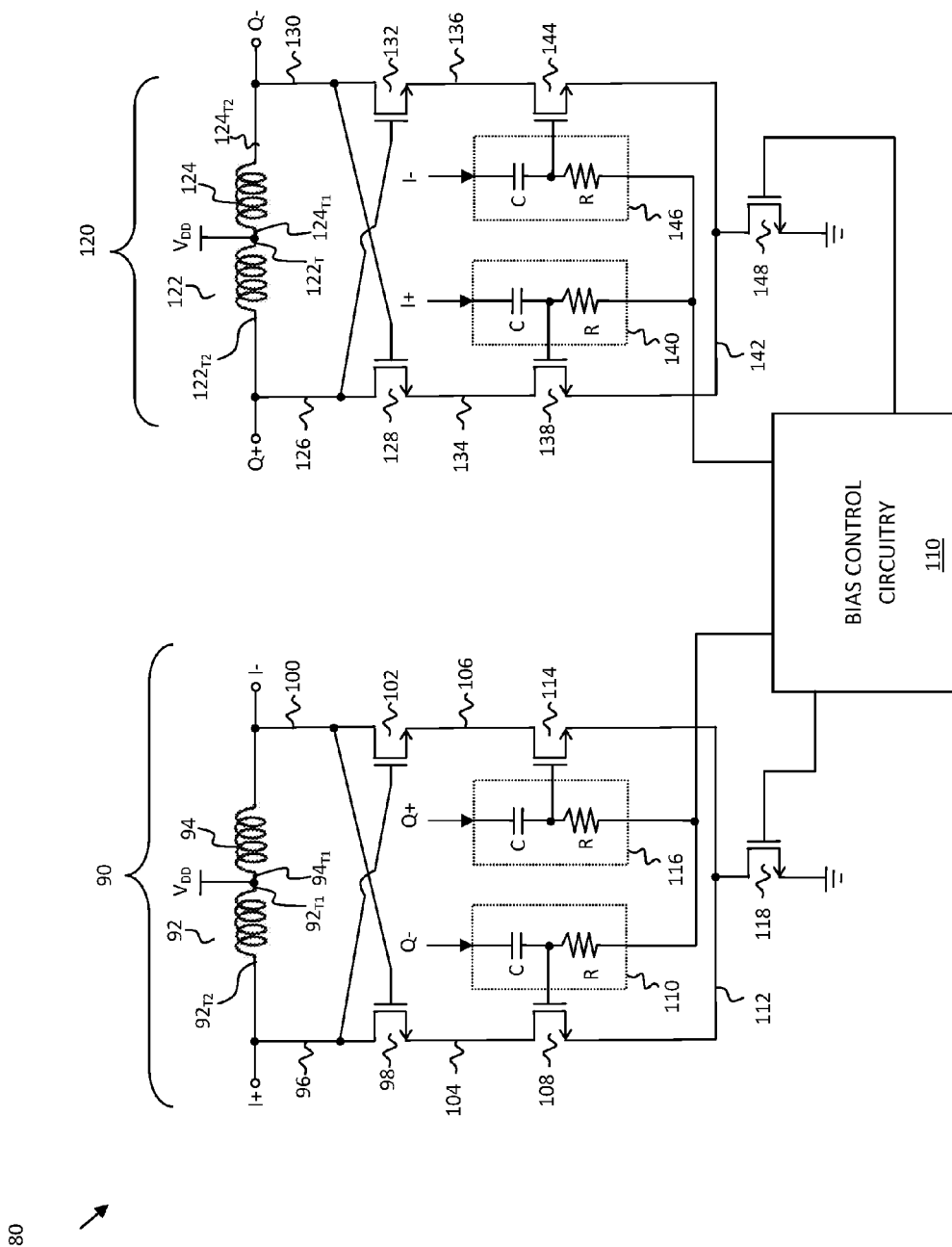
FIG. 2 illustrates an electrical schematic of a prior art series injection QVCO.

FIGS. 1 and 2 were described above in the Background of the Invention section of this document, and the reader is assumed familiar with the principles of that discussion.

Figure 3:
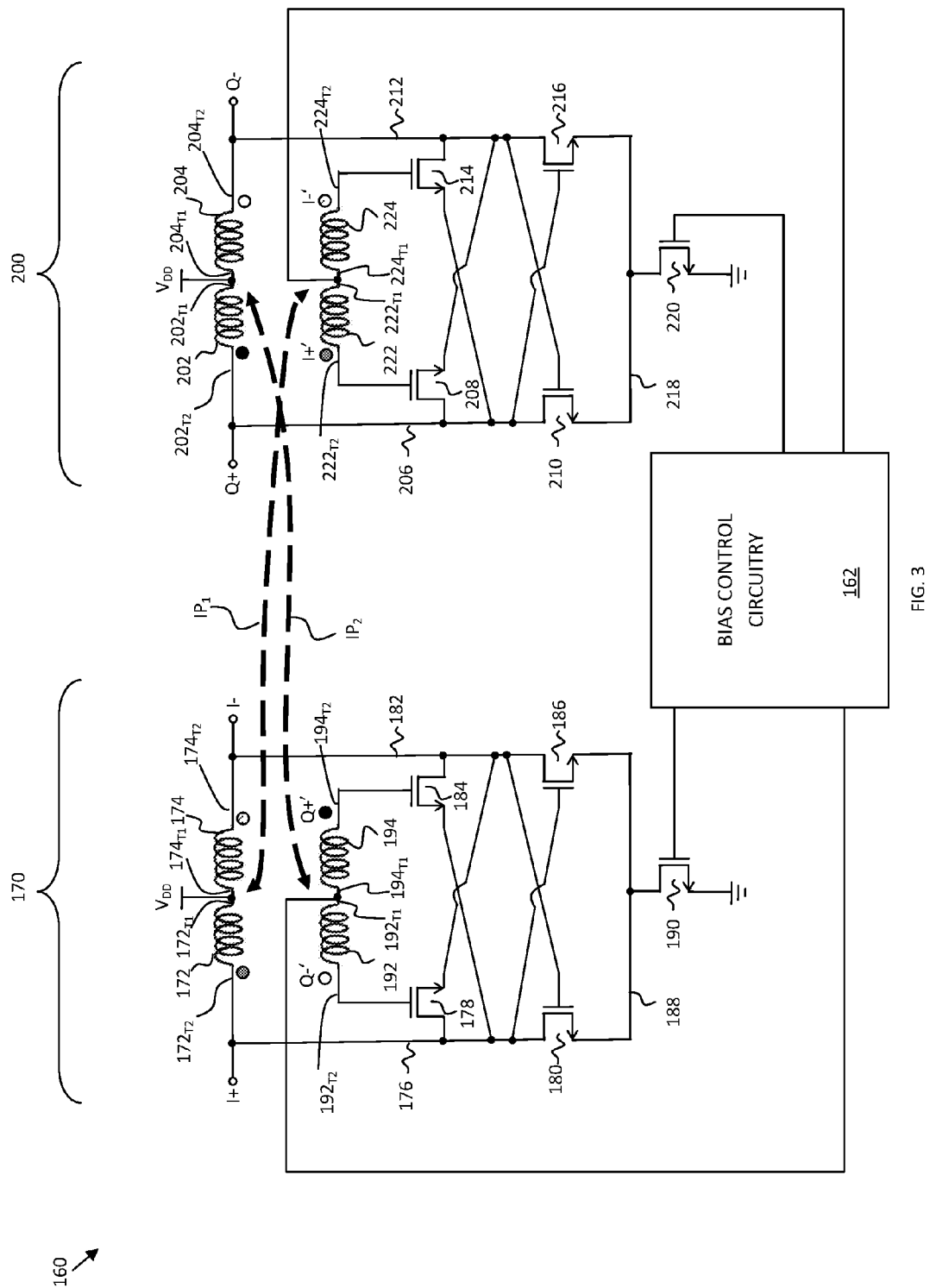
FIG. 3 illustrates an electrical schematic of a preferred embodiment QVCO.

FIG. 3 illustrates a schematic of a preferred embodiment quadrature voltage controlled oscillator (QVCO) shown generally at 160. QVCO 160 includes bias control circuitry 162 that may be constructed according to known principles for biasing a QVCO and more particularly for biasing QVCO 160, as further explored below. QVCO 160 also includes two symmetric oscillating circuits 170 and 200, which are inductively coupled to one another so as to lock the operation and oscillating signals of the two in quadrature, as will be explained later. Since circuits 170 and 200 are symmetric, the following discussion will detail circuit 170 by way of example, followed by an overview of the comparable circuit 200.

Oscillating circuit 170 includes a first inductor 172 and a second inductor 174, each having a respective first terminal $172_{T1}$ and $174_{T1}$ connected to receive a fixed voltage potential, shown as $V_{DD}$ (or this may be considered a center or other intermediary tap in a single inductor that is represented by both inductors 172 and 174). A second terminal $172_{T2}$ of inductor 172 is connected to a node 176, which is also connected to a drain of an nMOS transistor 178 and to a drain of an nMOS transistor 180. A second terminal $174_{T2}$ of inductor 174 is connected to a node 182, which is also connected to a drain of an nMOS transistor 184 and to a drain of an nMOS transistor 186. The source of nMOS transistor 178 is connected to node 182, and the source of nMOS transistor 184 is connected to node 176. The sources of nMOS transistors 180 and 186 are connected to a node 188, which is connected to the drain of an nMOS transistor 190, which has its source connected to ground and its gate connected to bias control circuitry 162. Oscillating circuit 170 also includes a third inductor 192 and a fourth inductor 194, each having a respective first terminal $192_{T1}$ and $194_{T1}$ connected to receive a bias voltage potential from bias control circuitry 162. A second terminal $192_{T2}$ of inductor 192 is connected to the gate of nMOS transistor 178, and a second terminal $194_{T2}$ of inductor 194 is connected to the gate of nMOS transistor 184.

Oscillating circuit 200 is comparable to oscillating circuit 170 and includes a first inductor 202 and a second inductor 204, each having a respective first terminal $202_{T1}$ and $204_{T1}$ connected to receive $V_{DD}$ (or this node also may be considered a center or other intermediary tap in a single inductor that is represented by both inductors 202 and 204). A second terminal $202_{T2}$ of inductor 202 is connected to a node 206, which is also connected to a drain of an nMOS transistor 208 and to a drain of an nMOS transistor 210. A second terminal $204_{T2}$ of inductor 204 is connected to a node 212, which is also connected to a drain of an nMOS transistor 214 and to a drain of an nMOS transistor 216. The source of nMOS transistor 208 is connected to node 212, and the source of nMOS transistor 214 is connected to node 206. The sources of nMOS transistors 210 and 216 are connected to a node 218, which is connected to the drain of an nMOS transistor 220, which has its source connected to ground and its gate connected to bias control circuitry 162. Oscillating circuit 200 also includes a third inductor 222 and a fourth inductor 224, each having a respective first terminal $222_{T1}$ and $224_{T1}$ connected to receive a bias voltage potential from bias control circuitry 162. A second terminal $222_{T2}$ of inductor 222 is connected to the gate of nMOS transistor 208, and a second terminal $224_{T2}$ of inductor 224 is connected to the gate of nMOS transistor 214.

Oscillating circuits 170 and 200 also are inductively coupled to one another, as is now described. The couplings in this respect are shown in FIG. 3 using the known inductor dot convention. Thus, inductor 172 of circuit 170 is coupled to inductor 222 of circuit 200, and inductor 174 of circuit 170 is coupled to inductor 224 of circuit 200—this coupling is also shown by way of a dashed inductive path arrow $IP_1$. In this sense, therefore, the pair of inductors 172 and 174 form a transformer pair with the pair of inductors 222 and 224. Further, inductor 192 of circuit 170 is coupled to inductor 204 of circuit 200, and inductor 194 of circuit 170 is coupled to inductor 202 of circuit 200—this coupling is also shown by way of a dashed inductive path arrow $IP_2$. In this sense, therefore, the pair of inductors 192 and 194 form a transformer pair with the pair of inductors 204 and 202. As is well known in the transformer art, therefore, a current through one (or one series pair) inductor will induce a current in the inductor to which it is inductively or magnetically coupled, typically by locating the inductors within a proximity to one another, with the distance of this proximity or other magnetically coupling technique being ascertainable by one skilled in the art.

The operation of QVCO 160 is now described. Looking first to oscillating circuit 170, in general an oscillating loop may be observed with respect to inductors 172 and 174 and nMOS transistors 180 and 186, which are enabled as bias control circuitry 162 enables the sourcing nMOS transistor 190 and $V_{DD}$ is applied between inductors 172 and 174. Moreover, with this loop, charge oscillates between the inductance and inherent transistor capacitance, and while resistance also exists in the circuit that would tend to diminish the response of the circuit, the cross-coupling of the gates of nMOS transistors 180 and 186 provides a negative trans-conductance to compensate for this resistance and to maintain the loop in oscillation. Thus, charge is exchanged in the loop and given the cross-coupling of nMOS transistors 180 and 186, the drain of one of those transistors rises in voltage while the other falls in complementary fashion, and vice versa, such that I+ and I− and those drains are anti-phase signals, that is, they remain 180 degrees (i.e., one half-period) apart from one another.

In addition to the preceding, nMOS transistors 178 and 184 receive at their gates an induced signal responsive to the respective antiphase signals Q− and Q+, from oscillating circuit 200, where these induced signals are shown in FIG. 3 and referred to herein as Q−' and Q+'. More particularly, at the same time that oscillating circuit 170 produces I+ and I− across inductors 172 and 174, oscillating circuit 200 comparably operates as bias control circuitry 162 enables its sourcing nMOS transistor 220 and $V_{DD}$ is applied between inductors 202 and 204, thereby producing Q+ and Q− across inductors 202 and 204; these latter inductors 202 and 204 induce respective counterpart signals in inductors 194 and 192 of oscillating circuit 170, whereby a signal Q−' is applied to the gate of nMOS transistor 178 and a signal Q+' is applied to the gate of nMOS transistor 184. Thus, while oscillating circuit 170 tends toward oscillation in the loop described above, further injected into that oscillating signal is the effect of the inter-coupled nMOS transistors 178 and 184, which also operate in complementary fashion with respect to one another, in response to Q−' and Q+', respectively. Looking similarly to oscillating circuit 200, therefore, comparable yet phase-shifted operation occurs, whereby again an oscillating loop may be observed with respect to inductors 202 and 204 and nMOS transistors 210 and 216, but at the same time that loop is further influenced in that among it are inter-coupled nMOS transistors 208 and 214, which operate in response to respective gate signals I+' and I−', those signals being induced into inductors 222 and 224 from inductors 172 and 174 of oscillating circuit 170. Thus, like the prior art, the two oscillating circuits 170 and 200 are locked in quadrature, but unlike the prior art different configurations are implemented, with additional benefits demonstrated below.

Having described the general operation of circuits 170 and 200, note further that such operation locks oscillating circuit 170 in quadrature with respect to oscillating circuit 200. As noted above, in each circuit the outputs (i.e., either Q+ and Q− or I+ and I−) are antiphase signals. By virtue of the cross-coupling, two tanks and the devices being identical and the magnitude of the phasor current in the two tanks to be equal, each of the four outputs will remain in quadrature, 90 degrees apart.

Figure 4:
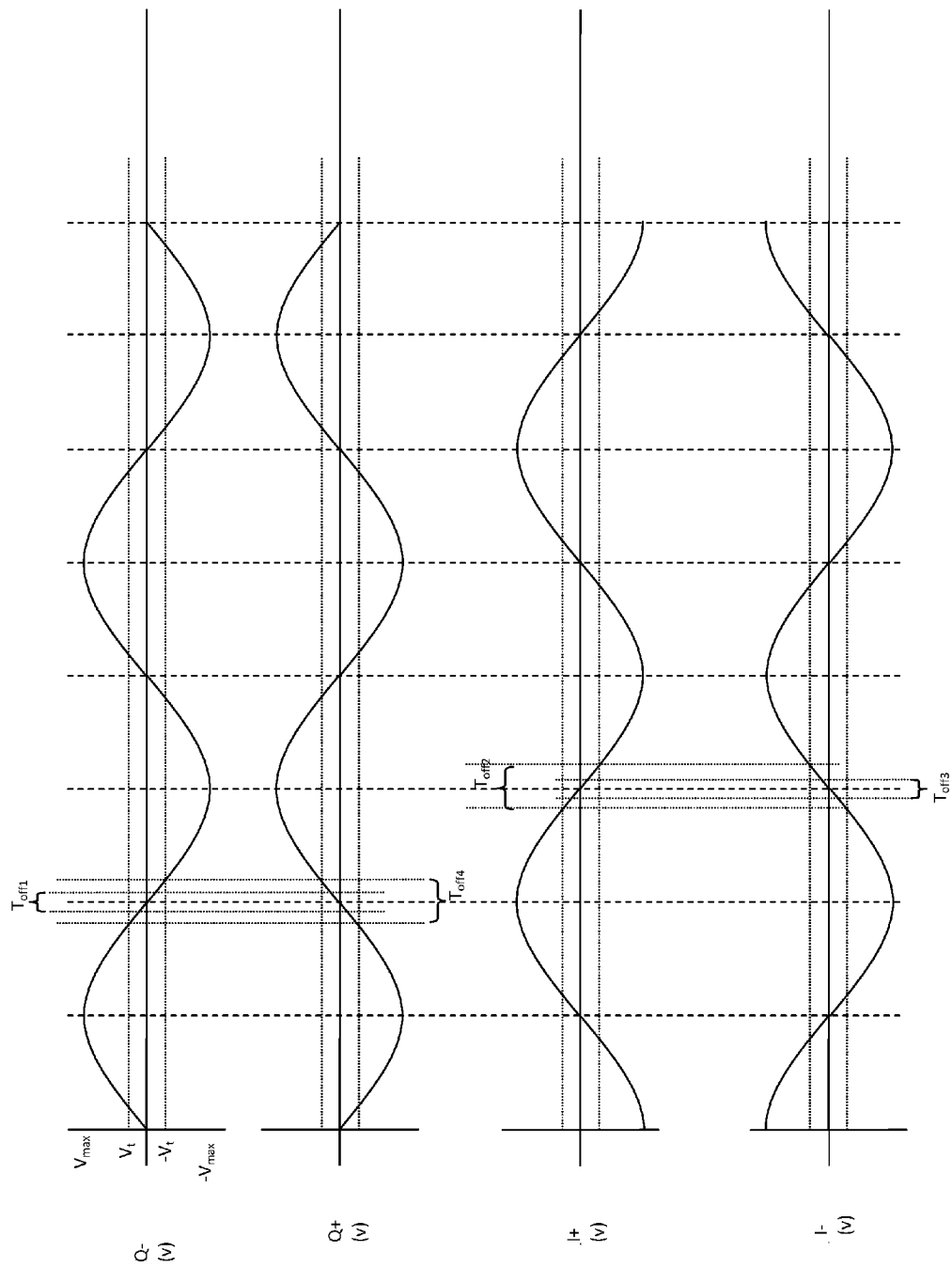
FIG. 4 illustrates a timing diagram of the in-phase and quadrature signals of the QVCO of FIG. 3.

FIG. 4 illustrates a timing diagram of the quadrature (i.e., Q− and Q+) and in-phase (i.e., I+ and I−) outputs for QVCO 160. As described above, in general the signals are antiphase and locked in quadrature, so FIG. 4 confirms that Q− and Q+ are 180 degrees apart and I+ and I− are also 180 degrees apart. FIG. 4 also demonstrates that I+ is shifted 90 degrees after Q− and I− is shifted 90 degrees after Q+. From the timing of these signals and the connections in FIG. 3, various benefits of the preferred embodiment may be observed as compared to the prior art, as addressed below.

In the prior art (e.g., FIGS. 1 and 2), the I/Q injection transistors are always kept on by the application of a DC signal, thereby continuously consuming power and also introducing flicker noise into the oscillator signal, which also gets upconverted to the frequency of interest/oscillation, thereby adding noise into the system that uses the oscillating signal. In contrast, the preferred embodiment of FIG. 3 does not support a DC current to the I/Q injection transistors (e.g., 178 and 184; 208 and 214) and also includes periods where the I/Q injection transistors are able to turn off, thereby reducing impact of flicker noise, while still sustaining the I/Q output oscillating signals. Such periods are further addressed below.

FIG. 4 illustrates a first period of turnoff time $T_{off1}$, which occurs where each of the antiphase signals Q− and Q+ approach 0 volts. Particularly, as this occurs, the voltage difference between the Q− and Q+ signals will, during $T_{off1}$, be close to 0 V for the I+/I− injection nMOS transistors 208 and 214. For example, consider nMOS transistor 208 during this time, at which points its drain (node 206) voltage Q+ to source (node 212) voltage Q− will be approximately 0 V, thereby causing that transistor to not inject. In comparable fashion, for nMOS transistor 214 during this time, its drain (node 212) voltage Q− to source (node 206) voltage Q+ will be approximately 0 V, thereby causing that transistor also to not inject.

FIG. 4 also illustrates a period of turnoff time $T_{off2}$, which occurs as I+ is within $\pm V_t$ of an injection nMOS transistor 208 and I− is within $\pm V_t$ of an injection nMOS transistor 214. Particularly, as these conditions occur, the induced signal I+' at the gate of nMOS transistor 208 provides an insufficient gate-to-source voltage to turn transistor 208 on, and likewise the induced signal I−' at the gate of nMOS transistor 214 provides an insufficient gate-to-source voltage to turn transistor 214 on. Given the preceding, note that the I+/I− injection nMOS transistors 208 and 214 are turned off for at least the total time periods of $T_{off1}+T_{off2}$.

Note that periods comparable to turn-off periods $T_{off1}$ and $T_{off2}$ in oscillating circuit 200 also occur in oscillating circuit 170 and are shown in FIG. 4 as $T_{off3}$ and $T_{off4}$. Specifically, during turn-off period $T_{off3}$, antiphase signals I+ and I− approach 0 volts, so that during this time the voltage difference between the I+ and I− signals will be less than the threshold voltage $V_t$ for the Q+/Q− injection nMOS transistors 178 and 184, and that difference is applied as the source-to-drain voltage for those two transistors, thereby causing them to turn off. Further, during turn-off period $T_{off4}$, Q+ and Q− are within $\pm V_t$ of injection nMOS transistors 178 and 184 and, as these conditions occur, the induced signal Q+' at the gate of nMOS transistor 184 provides an insufficient gate-to-source voltage to turn transistor 184 on, and likewise the induced signal Q−' at the gate of nMOS transistor 178 provides an insufficient gate-to-source voltage to turn transistor 178 on. Given the preceding, note that the Q+/Q− injection nMOS transistors 184 and 178 are turned off for at least the total time periods of $T_{off3}+T_{off4}$.

As another observation, the preferred embodiment QVCO 160 also permits bias control circuitry 162 to establish the potential at what are effectively center taps between inductors 192 and 194 and inductors 222 and 224. This adjustability allows a tuning to adjust the gate potential of either nMOS transistors 178 as and 184 to the former center tap or nMOS transistors 208 and 214 as to the latter center tap, for example to address any mismatch between each transistor in either pair of transistors or to ensure a locked I/Q quadrature (i.e., with all four signals maintained at or close to 90 degrees apart). As a result, contributions to phase noise from either amplitude modulation or phase modulation also may be addressed with such an adjustment.

From the above, the preferred embodiments are shown to provide a QVCO with improved performance, achieved in one preferred embodiment by eliminating any DC bias to the I/Q injection transistors. In a preferred embodiment, such an approach is implemented using induced oscillating (AC) signals to drive the I/Q injection transistor gates, without a separate DC bias applied thereto. The preferred embodiment QVCO also improves performance by implementing periods of time when the I/Q injection transistors may be disabled, during the quiet state of operation so that quadrature locked oscillating output signals continue while saving power, as compared to the prior art. Adjustability is also provided for fine-grain tuning and improved from amplitude modulation or phase modulation operation. Thus, the preferred embodiments are demonstrated to have numerous benefits, and still others will be further determined by one skilled in the art. Still further, while various alternatives have been provided according to the disclosed embodiments, still others are contemplated and yet others can ascertained by one skilled in the art. For example, while each of transistors 178, 184, 208 and 214 is shown and described as a nMOS transistor, in alternative preferred embodiments any of those devices may be mPMOS, even a of both nMOS and pMOS. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:
1. A quadrate voltage controlled oscillator for providing an oscillating output signal, comprising:

a first oscillating circuit for producing a first output signal and a second output signal, wherein the first output signal and the second output signal comprises a first set of antiphase signals;

a second oscillating circuit for producing a third output signal and a fourth output signal, wherein the third output signal and the fourth output signal comprises a second set of antiphase signals;

the first oscillating circuit comprising injection circuitry for injecting the second set of antiphase signals without a DC current into the first output signal and the second output signal; and the second oscillating circuit comprising injection circuitry for injecting the first set of antiphase signals without a DC current into the third output signal and the fourth output signal;

wherein the first oscillating circuit comprises:
a first node for producing the first output signal;
a second node for producing the second output signal; and
at least one inductor between the first node and the second node; and wherein the second oscillating circuit comprises:
a third node for producing the third output signal;
a fourth node for producing the fourth output signal; and
at least one inductor between the third node and the fourth node;

wherein the injection circuitry of the first oscillating circuit comprises an inductor inductively coupled to the at least one inductor of the second oscillating circuit; and wherein the injection circuitry of the second oscillating circuit comprises an inductor inductively coupled to the at least one inductor of the first oscillating circuit.

2. The quadrature voltage controlled oscillator of claim 1:
wherein the inductor inductively coupled to the at least one inductor of the second oscillating circuit has a first terminal coupled to a gate of a first transistor in the first oscillating circuit and a second terminal coupled to a gate of a second transistor in the first oscillating circuit; and wherein the inductor inductively coupled to the at least one inductor of the first oscillating circuit has a first terminal coupled to a gate of a first transistor in the second oscillating circuit and a second terminal coupled to a gate of a second transistor in the second oscillating circuit.

3. The quadrature voltage controlled oscillator of claim 2:
wherein the first transistor in the first oscillating circuit and the second transistor in the first oscillating circuit comprise nMOS transistors; and
wherein the first transistor in the second oscillating circuit and the second transistor in the second oscillating circuit comprise nMOS transistors.

4. The quadrature voltage controlled oscillator of claim 2:
wherein the first transistor in the first oscillating circuit and the second transistor in the first oscillating circuit comprise pMOS transistors; and
wherein the first transistor in the second oscillating circuit and the second transistor in the second oscillating circuit comprise pMOS transistors.

5. The quadrature voltage controlled oscillator of claim 2:
wherein the first transistor in the first oscillating circuit has a source/drain path connected between the first node and the second node;

wherein the second transistor in the first oscillating circuit has a source/drain path connected between the first node and the second node;
wherein the first transistor in the second oscillating circuit has a source/drain path connected between the third node and the fourth node; and
wherein the second transistor in the second oscillating circuit has a source/drain path connected between the third node and the fourth node.

6. The quadrature voltage controlled oscillator of claim 5 and further comprising:
circuitry for applying a first DC bias to a center tap of the inductor inductively coupled to the at least one inductor of the second oscillating circuit; and
circuitry for applying a second DC bias to a center tap of the inductor inductively coupled to the at least one inductor of the first oscillating circuit.

7. The quadrature voltage controlled oscillator of claim 6:
wherein the first oscillating circuit further comprises:
a third transistor having a gate coupled to the second node and a source/drain path between the first node and a first current source; and
a fourth transistor having a gate coupled to the first node and a source/drain path between the second node and the first current source; and wherein the second oscillating circuit further comprises:
a third transistor having a gate coupled to the fourth node and a source/drain path between the third node and a second current source; and
a fourth transistor having a gate coupled to the third node and a source/drain path between the fourth node and the second current source.

8. The quadrature voltage controlled oscillator of claim 7:
wherein the third transistor in the first oscillating circuit and the fourth transistor in the first oscillating circuit comprise nMOS transistors; and
wherein the third transistor in the second oscillating circuit and the fourth transistor in the second oscillating circuit comprise nMOS transistors.

9. The quadrature voltage controlled oscillator of claim 1 and further comprising:
circuitry for applying a first DC bias to a center tap of the inductor inductively coupled to the at least one inductor of the second oscillating circuit; and
circuitry for applying a second DC bias to a center tap of the inductor inductively coupled to the at least one inductor of the first oscillating circuit.

10. The quadrature voltage controlled oscillator of claim 1:
wherein the inductor inductively coupled to the at least one inductor of the second oscillating circuit has a first terminal coupled to a gate of a first transistor in the first oscillating circuit and a second terminal coupled to a gate of a second transistor in the first oscillating circuit, the first transistor and second transistor in the first oscillating circuit operable to be on for a portion of a period of the first output signal and to be off for a portion of a period of the first output signal; and
wherein the inductor inductively coupled to the at least one inductor of the first oscillating circuit has a first terminal coupled to a gate of a first transistor in the second oscillating circuit and a second terminal coupled to a gate of a second transistor in the second oscillating circuit, the first transistor and second transistor in the second oscillating circuit operable to be on for a portion of a period of the second output signal and to be off for a portion of a period of the second output signal.

11. A method of providing an oscillating output from a quadrate voltage controlled oscillator, comprising:
   producing a first output signal and a second output signal from a first oscillating circuit, wherein the first output signal and the second output signal comprises a first set of antiphase signals;
   producing a third output signal and a fourth output signal from a second oscillating circuit, wherein the third output signal and the fourth output signal comprises a second set of antiphase signals;
   wherein the step of producing a first output signal and a second output signal from a first oscillating circuit comprises injecting the second set of antiphase signals without a DC current into the first output signal and the second output signal; and
   wherein the step of producing a third output signal and a fourth output signal from a second oscillating circuit comprises injecting the first set of antiphase signals without a DC current into the third output signal and the fourth output signal;
   wherein the step of injecting the second set of antiphase signals without a DC current into the first output signal and the second output signal comprises inducing a signal into the first oscillating circuit from the second oscillating circuit; and
   wherein the step of injecting the first set of antiphase signals without a DC current into the third output signal and the fourth output signal comprises inducing a signal into the second oscillating circuit from the first oscillating circuit.

12. The method of claim 11 and further comprising:
   discontinuing the injecting of the second set of antiphase signals without a DC current into the first output signal and the second output signal for a portion of a period of the oscillating output; and
   discontinuing the injecting of the first set of antiphase signals without a DC current into the third output signal and the fourth output signal for a portion of a period of the oscillating output.

* * * * *